(12) United States Patent
Park et al.

(10) Patent No.: US 11,411,003 B2
(45) Date of Patent: Aug. 9, 2022

(54) DYNAMIC RANDOM ACCESS MEMORY DEVICE AND MANUFACTURING METHOD THEREOF

(71) Applicant: Winbond Electronics Corp., Taichung (TW)

(72) Inventors: Cheol-Soo Park, Taichung (TW); Ming-Tang Chen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 2 days.

(21) Appl. No.: 17/166,583

(22) Filed: Feb. 3, 2021

(65) Prior Publication Data

US 2021/0242209 A1 Aug. 5, 2021

(30) Foreign Application Priority Data

Feb. 3, 2020 (TW) .................................. 109103153

(51) Int. Cl.
*H01L 27/108* (2006.01)
(52) U.S. Cl.
CPC .... *H01L 27/10805* (2013.01); *H01L 27/1085* (2013.01)
(58) Field of Classification Search
None
See application file for complete search history.

(56) References Cited

U.S. PATENT DOCUMENTS 6,624,018 B1 * 9/2003 Yu .......................... H01L 28/87
438/243

FOREIGN PATENT DOCUMENTS

| TW | 380316 B | 1/2000 |
|----|----------|--------|
| TW | 381340 B | 2/2000 |
| TW | I625826 B | 6/2018 |

* cited by examiner

*Primary Examiner* — Anthony Ho
*Assistant Examiner* — Kevin Quinto
(74) *Attorney, Agent, or Firm* — Muncy, Geissler, Olds & Lowe, P.C.

(57) ABSTRACT

A DRAM device and its manufacturing method are provided. The DRAM device includes an interlayer dielectric layer and capacitor units framed on a substrate. The interlayer dielectric layer has capacitor unit accommodating through holes and includes a first support layer, a composite dielectric layer, and a second support layer sequentially formed on the substrate. The composite dielectric layer includes at least one first insulating layer and second insulating layer alternately stacked. Each capacitor unit accommodating through hole forms a first opening in the second insulating layer and forms a second opening communicating with the first opening in the first insulating layer. The second opening is wider than the first opening. The capacitor units are formed in the capacitor unit accommodating through holes. The top of the capacitor unit is higher than the top surface of the interlayer dielectric layer and defines a recessed region.

20 Claims, 7 Drawing Sheets

DYNAMIC RANDOM ACCESS MEMORY DEVICE AND MANUFACTURING METHOD THEREOF

CROSS REFERENCE TO RELATED APPLICATIONS

This application claims priority of Taiwan Patent Application No. 109103153, filed on Feb. 3, 2020, the entirety of which is incorporated by reference herein.

BACKGROUND OF THE INVENTION

Field of the Invention

The present disclosure relates to a memory device, and in particular, it relates to a dynamic random access memory device and a method for manufacturing the dynamic random access memory device.

Description of the Related Art

With the trend of miniaturization of electronic products, there is also a demand for miniaturization of memory devices. However, with the miniaturization of memory devices, it has become more difficult to improve the performance and yield of the product.

For example, in the conventional method for manufacturing a dynamic random access memory (DRAM), the capacitor units are formed in through holes of a multi-layer insulating structure. In the subsequent process of removing the multi-layer insulating structure, the bottom of the capacitor unit may be damaged easily, so that the subsequent etching solution may easily penetrate into the underlying insulating layer or the conductive contact plug via the damaged capacitor unit. As a result, the insulating layer, the conductive contact plug, and even the lower components in the substrate are damaged, thereby greatly reducing the yield of the DRAM device.

In order to solve the above problem, the thickness of the bottom electrode structure of the capacitor unit may be increased. However, the bottom electrode structure is cup-shaped. When the inner diameter of the through hole of the multi-layer insulating structure is fixed, as the bottom electrode structure becomes thicker, the contact area between the bottom electrode structure and the dielectric layer disposed on the bottom electrode structure becomes smaller. As a result, the capacitance value of the capacitor unit becomes smaller, which will reduce the performance of the memory device. Furthermore, it is difficult for such a solution to reduce the critical dimension, which is disadvantageous for the miniaturization of the memory device.

In addition, the cup-shaped bottom electrode structure has a high aspect ratio and a small size, and its material will generate stress. In the absence of sufficient support, it is easy to cause the bottom electrode structure to collapse or crack due to subsequent manufacturing processes (for example, thermal expansion due to high temperature), which may cause short circuit or leakage current between different capacitor units. As a result, the yield will be reduced. When the critical dimension of the memory cell is smaller, the above-mentioned collapse or crack of the bottom electrode structure is more easily to occur. Therefore, with the miniaturization of the memory device, the above-mentioned problems will become more serious.

For the memory industry, in order to improve the performance and yield of the DRAM device, there is still a need to improve the DRAM and the manufacturing process thereof.

BRIEF SUMMARY OF THE INVENTION

The embodiments of the present invention provides a DRAM device and a method for manufacturing the same. The DRAM device can significantly improve the performance and yield of the product, and can facilitate the miniaturization of the memory device.

In accordance with some embodiments of the present disclosure, a DRAM device is provided. The DRAM device includes a substrate, an interlayer dielectric layer, a plurality of capacitor units, and a first conductive layer. The interlayer dielectric layer is formed on the substrate. The interlayer dielectric layer has a plurality of capacitor unit accommodating through hole, and each of the capacitor unit accommodating through holes penetrates the interlayer dielectric layer. The interlayer dielectric layer includes a first support layer, a composite dielectric layer, and a second support layer. The first support layer is formed on the substrate. The composite dielectric layer is formed on the first support layer. The composite dielectric layer includes at least one first insulating layer and at least one second insulating layer alternately stacked. Each of the capacitor unit accommodating through holes forms a first opening in the second insulating layer and forms a second opening communicating with the first opening in the first insulating layer. A width of the second opening is greater than a width of the first opening. The second support layer is formed on the composite dielectric layer. The plurality of capacitor units are formed in the capacitor unit accommodating through holes. Tops of the capacitor units are higher than a top surface of the interlayer dielectric layer, and the tops of the capacitor units define a recessed region. The first conductive layer is formed between the substrate and the interlayer dielectric layer, wherein the first conductive layer has a plurality of third openings communicating with the capacitor unit accommodating through holes, and the capacitor units further formed in the third opening.

In accordance with some embodiments of the present disclosure, a method for manufacturing a DRAM device is provided. The method includes forming a first conductive layer over a substrate. The method includes forming an interlayer dielectric layer on the first conductive layer. The interlayer dielectric layer has a plurality of capacitor unit accommodating through holes, and each of the capacitor unit accommodating through holes penetrates the interlayer dielectric layer. Forming the interlayer dielectric layer includes forming a first support layer on the substrate, forming a composite dielectric layer on the first support layer, and forming a second support layer on the composite dielectric layer. The composite dielectric layer includes at least one first insulating layer and at least one second insulating layer alternately stacked. Each of the capacitor unit accommodating through holes forms a first opening in the second insulating layer and forms a second opening communicating with the first opening in the first insulating layer. A width of the second opening is greater than a width of the first opening. The method includes forming a plurality of capacitor units in the capacitor unit accommodating through holes. Tops of the capacitor units are higher than a top surface of the interlayer dielectric layer, and the tops of the capacitor units define a recessed region. Wherein the first conductive layer has a plurality of third openings communicating with the capacitor unit accommodating through holes, and the capacitor units further formed in the third opening.

In the DRAM device provided by the embodiment of the present invention, the capacitor unit has a plurality of fin structures, and the top of the capacitor unit is higher than the top surface of the interlayer dielectric layer, thereby increasing the sensing capacitance of the capacitor unit. As a result, the performance of the DRAM device is improved. In the DRAM device provided by the embodiment of the present invention, the capacitor unit accommodating through hole is configured to have a concave-convex shape. Therefore, the bottom electrode structure can be well supported by the first support layer, the composite dielectric layer, and the second support layer. As a result, short circuit or leakage current can be avoided, and the yield of the DRAM device can be greatly improved.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The present disclosure is made for the purpose of illustrating the general principles of the invention and should not be taken in a limiting sense. The scope of the invention is best determined by reference to the appended claims. The present disclosure is best understood from the following detailed description when read with the accompanying figures. It should be noted that, in accordance with the standard practice in the industry, various features are not drawn to scale. In fact, the relative dimensions of the various features may be arbitrarily increased or reduced for clarity of discussion. In addition, the present disclosure may repeat reference numerals and/or letters in the various examples. This repetition is for the purpose of simplicity and clarity and does not in itself dictate a relationship between the various embodiments and/or configurations discussed.

Figure 1A:
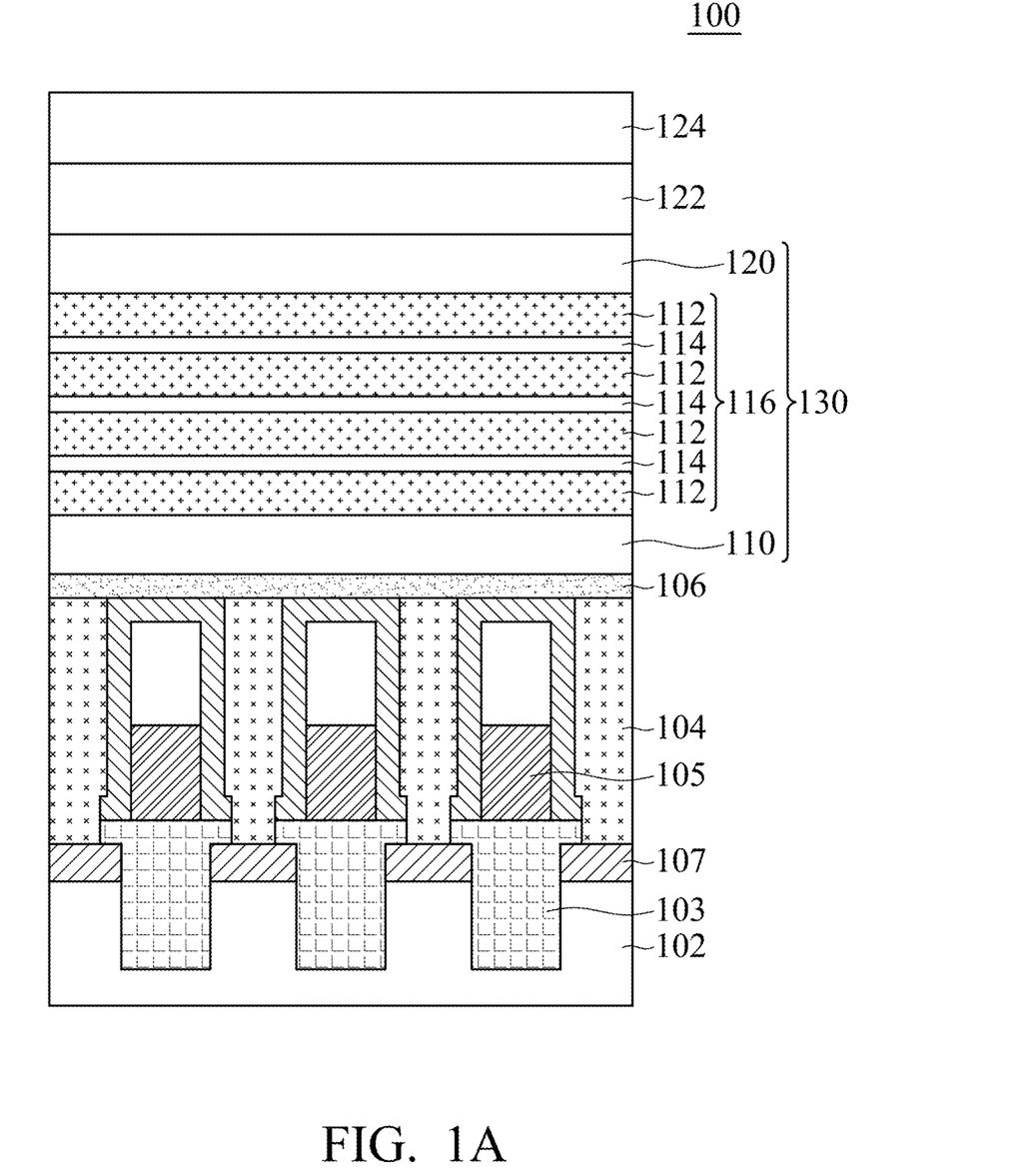
FIGS. 1A-1G are cross-sectional views corresponding to various steps of manufacturing a DRAM device in accordance with some embodiments.

FIGS. 1A-IG are cross-sectional views corresponding to various steps of manufacturing a DRAM device 100 in accordance with some embodiments. Referring to FIG. 1A, a substrate 102 is provided. In some embodiments, isolation structures 103 and source/drain structures 107 are formed in the substrate 102, and contact structures 104 and gate structures 105 are formed on the substrate 102. The material of the substrate 102 may include silicon, silicon-containing semiconductor, silicon on insulator (SOI), other suitable materials, or a combination thereof. In the present embodiment, the material of the substrate 102 is silicon. In some embodiments, the isolation structure 103 may include silicon oxide; the gate structure 105 may include monocrystalline silicon, polycrystalline silicon, metals, alloys, or other suitable conductive material; the contact structure 104 may include monocrystalline silicon, polycrystalline silicon, metals, alloys, or other suitable conductive material; and the source/drain structure 107 may include P-type doped polycrystalline silicon or N-type doped polycrystalline silicon. In some embodiments, the gate structure 105 may include sidewall spacers to electrically isolate the contact structure 104. The isolation structure 103, the contact structure 104, the gate structure 105, and the source/drain structure 107 can be formed by any conventional process, and these conventional processes will not be described in detail herein. In the present embodiment, a planarization process may be optionally performed to make the top surface of the contact structure 104 and the top surface of the gate structure 105 coplanar.

Then, a first conductive layer 106 is formed on the contact structure 104 and the gate structure 105. The material of the first conductive layer 106 may include titanium, tantalum, titanium nitride, tantalum nitride, other suitable conductive materials, or a combination thereof. The first conductive layer 106 may be a single-layer structure formed of a single material or a multi-layer structure formed of a plurality of different materials. The first conductive layer 106 may be formed by a physical vapor deposition process, a chemical vapor deposition (CVD) process, an atomic layer deposition (ALD) process, or other suitable deposition processes. In some embodiments, the first conductive layer 106 is a dual-layer structure formed by titanium/titanium nitride.

Then, an interlayer dielectric layer 130 is formed on the first conductive layer 106. The interlayer dielectric layer 130 can be formed by sequentially forming a first support layer 110, a composite dielectric layer 116, and a second support layer 120.

The first support layer 110 and the second support layer 120 may provide a supporting function to prevent the bottom electrode structure 140 subsequently formed from being collapsed or cracked during the manufacturing process. The first support layer 110 and the second support layer 120 can be formed of the material having higher density. Furthermore, in order to avoid the widening of the subsequently formed first opening 115 in the wet etching process (for example, the second etching process), the first support layer 110 and the second support layer 120 may be formed of the material having better resistance to acid etching. The first support layer 110 and the second support layer 120 may independently include nitride, oxynitride, carbonitride, or a combination thereof. In the present embodiment, both the first support layer 110 and the second support layer 120 are made of nitride.

The composite dielectric layer 116 may include at least one first insulating layer 112 and at least one second insulating layer 114 that are alternately stacked. In the present embodiment, the composite dielectric layer 116 includes four first insulating layers 112 and three second insulating layers 114 alternately stacked, as shown in FIG. 1A. The first insulating layer 112 and the second insulating layer 114 may independently include oxide, nitride, or oxynitride. In order to facilitate the formation of subsequent capacitor unit accommodating through holes 121, different materials may be used to form the first insulating layer 112 and the second insulating layer 114, respectively. In the present embodiment, the first insulating layer 112 is made of oxide, and the second insulating layer 114 is made of nitride.

Then, a stress adjustment layer 122 is formed on the second support layer 120, and a mask layer 124 is formed on the stress adjustment layer 122. The material of the stress adjustment layer 122 may include silicon oxynitride, silicon oxide, or silicon nitride. The material of the mask layer 124 may include polycrystalline silicon, silicon boride (SiB), or silicon boron nitride (SiBN).

Figure 1B:
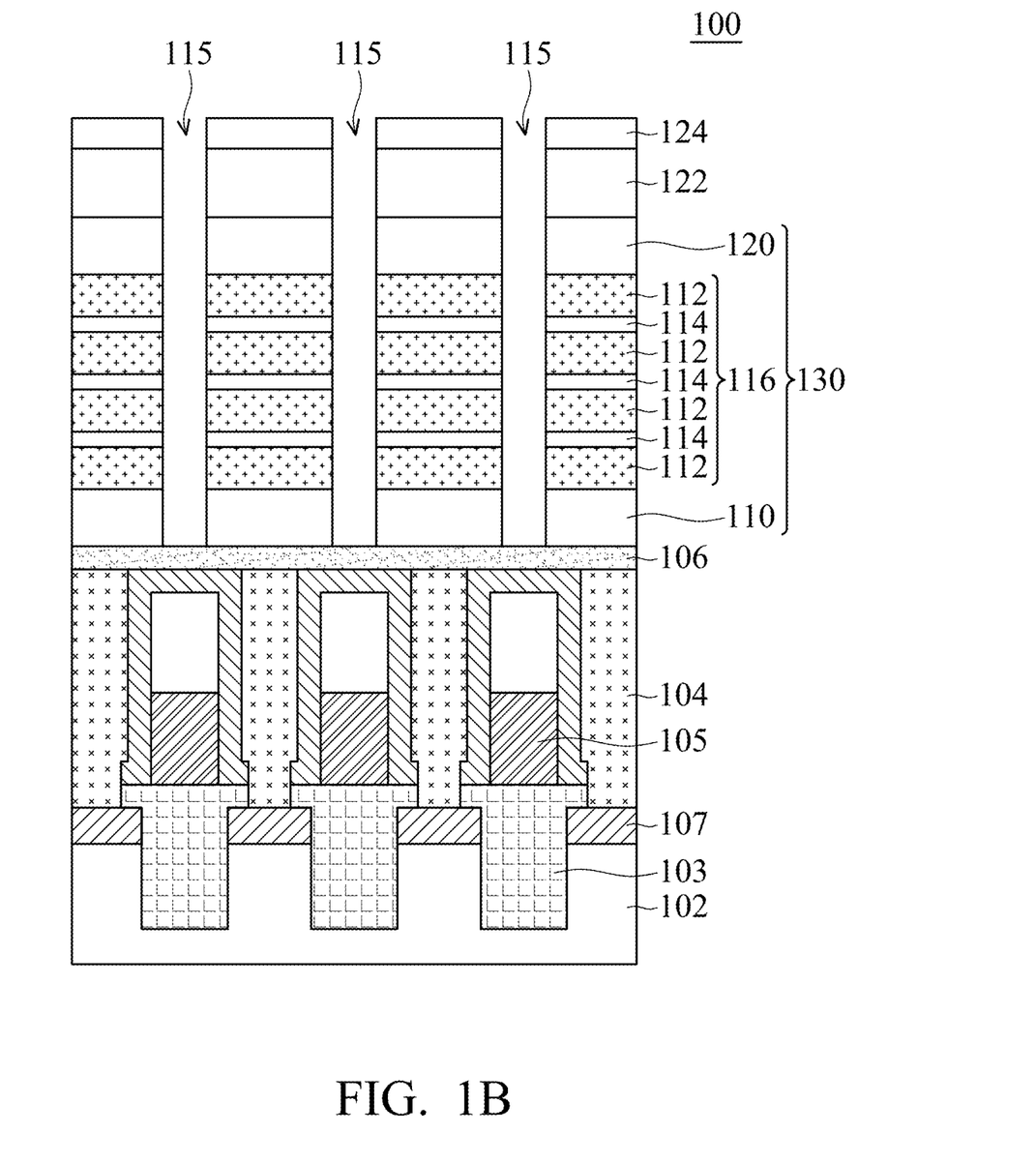
Figure 1C:
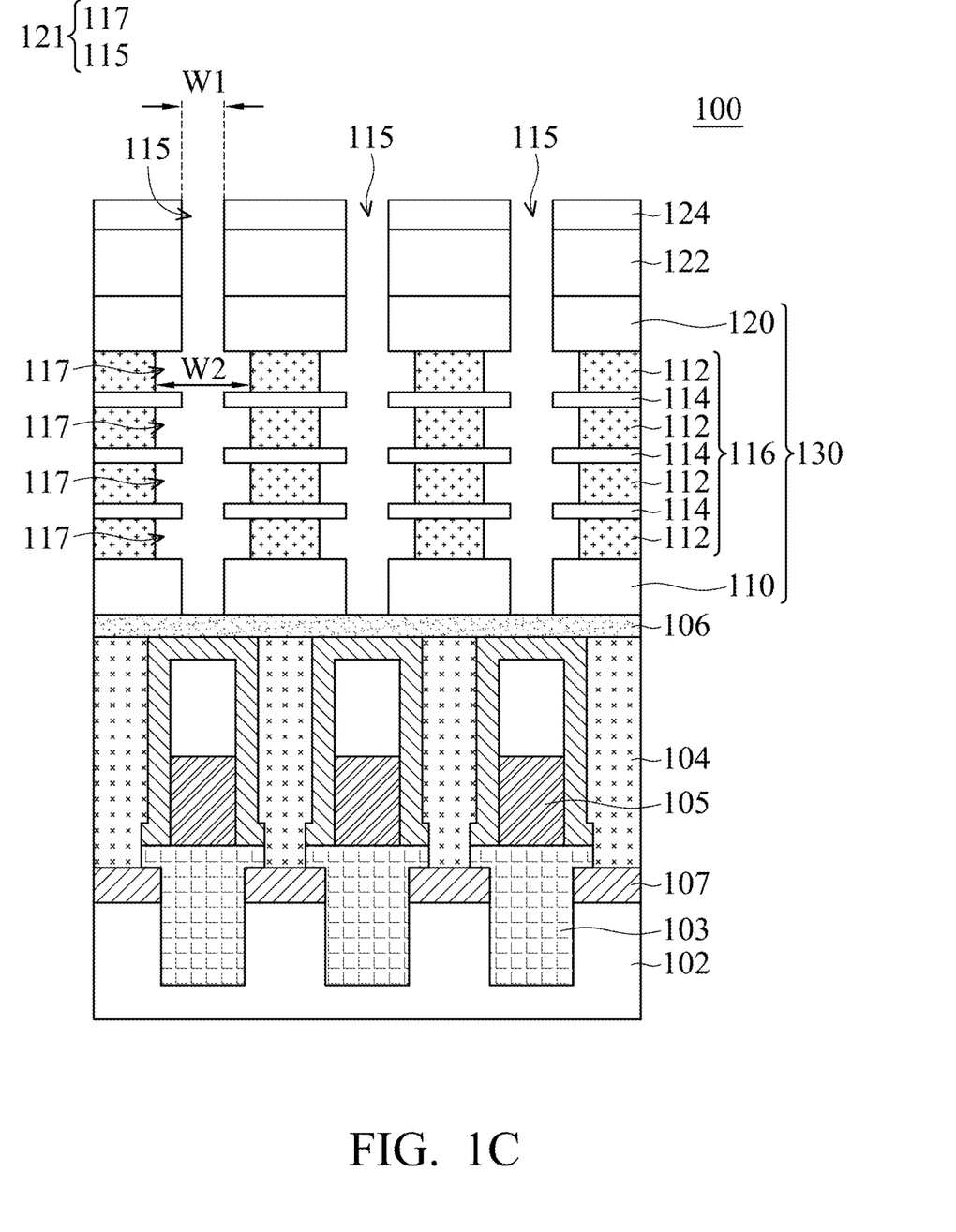

Then, a patterning process is performed to form a plurality of capacitor unit accommodating through holes 121 in the interlayer dielectric layer 130. As shown in FIG. 1B a first etching process is performed to form a first opening 115 through the mask layer 124, the stress adjustment layer 122, the second support layer 120, the composite dielectric layer 116, and the first support layer 110. The first etching process may be an anisotropic etching process, for example, a dry etching process. Then, as shown in FIG. 1C, a second etching process is performed to remove a portion of the first insulating layer 122, and a second opening 117 communicating with the first opening 115 is formed in the first insulating layer 112. In other words, the sidewall of the capacitor unit accommodating through hole 121 formed by the first opening 115 and the second opening 117 has a concave-convex shape. The second etching process may be an isotropic etching process, for example, a wet etching process. In order to form the second opening 117, the etching selectivity of the second etching process may be adjusted. In some embodiments, during the second etching process, the ratio R1/R2 of the etching rate R1 of the first insulating layer 112 to the etching rate R2 of the second insulating layer 114 is 10-100.

Next, a plurality of capacitor units 146 are formed in the capacitor unit accommodating through holes 121. First, referring to FIG. 1D, a third etching process is performed to form a third opening 119 communicating with the first opening 115 in the first conductive layer 106, and the mask layer 124 is removed. The third etching process may be an anisotropic etching process, for example, a dry etching process. Then, a bottom electrode material 140* is conformally formed on the surface of the capacitor unit accommodating through hole 121, on the surface of the opening 119, and on the stress adjustment layer 122. The bottom electrode material 140* may include titanium, titanium nitride, tungsten nitride, tantalum, tantalum nitride, or other suitable conductive materials. The bottom electrode material 140* may be formed by an ALD process or other suitable deposition processes.

Figure 1D:
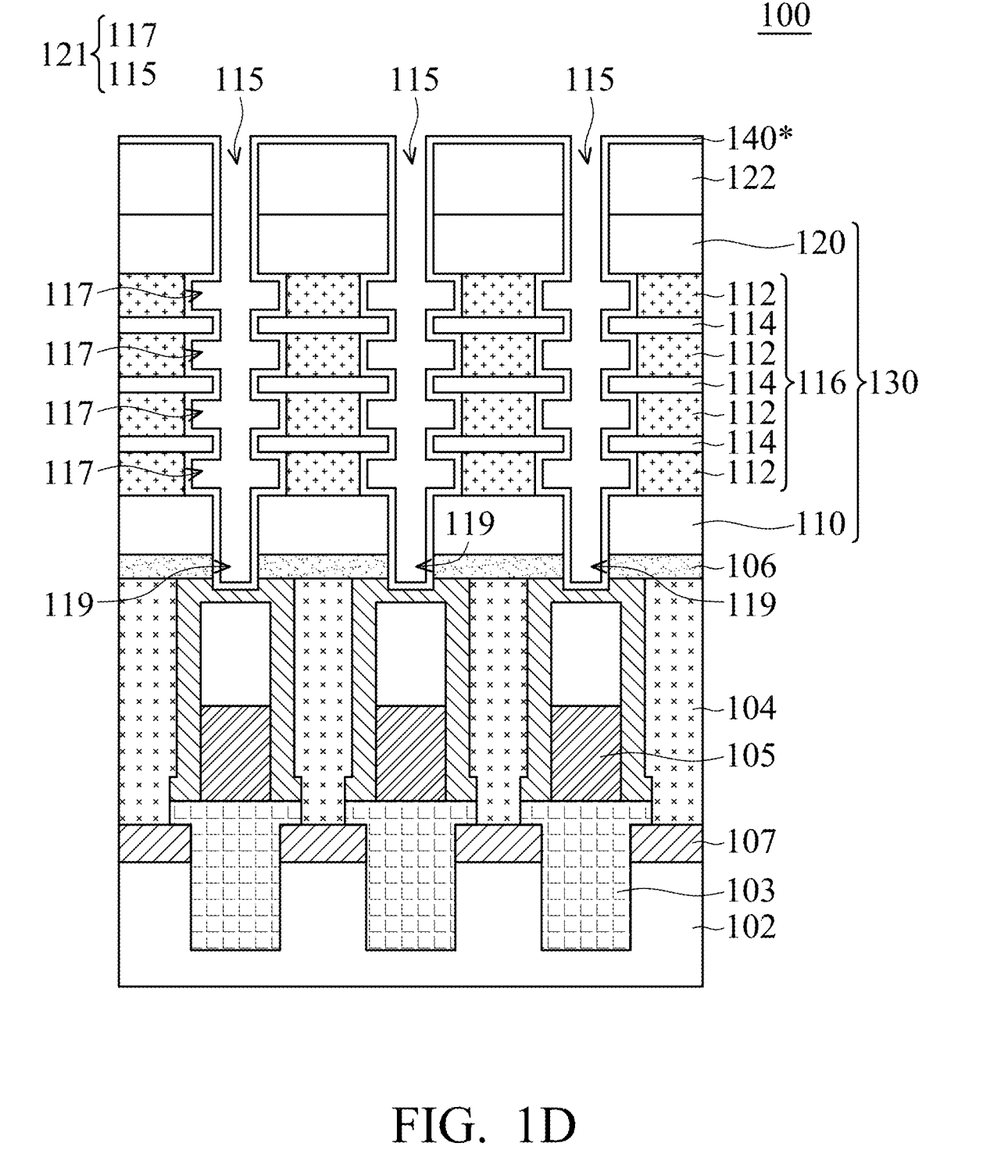
Figure 1E:
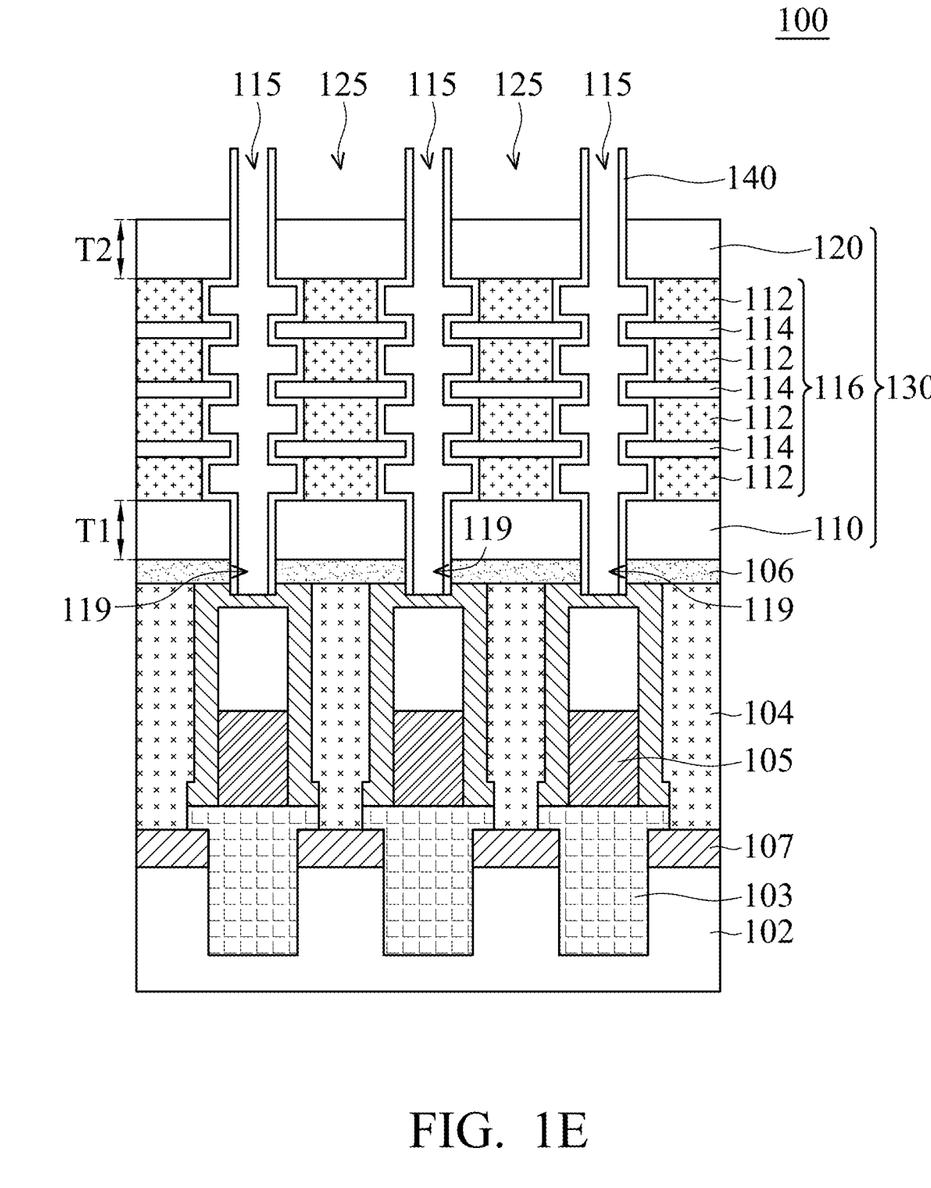

Referring to FIG. 1E, a fourth etching process is performed to remove the bottom electrode material 140* on the bottom surface of the third opening 119 and the top surface of the stress adjustment layer 122, thereby forming the bottom electrode structure 140. The fourth etching process may be an anisotropic etching process, for example, a dry etching process. Then, a fifth etching process is performed to remove the stress adjustment layer 122 and make the bottom electrode structure 140 protrude beyond the second support layer 120. The fifth etching process may be dry etching process, a wet etching process, or a combination thereof. In order to remove the stress adjustment layer 122 and retain the second support layer 120 and bottom electrode structure 140 the etching selectivity of the fifth etching process may be adjusted. In some embodiments, during the fifth etching process, the ratio R3/R4 of the etching rate R3 of the stress adjustment layer 122 to the etching rate R4 of the second support layer 120 is 10-100, and the ratio R3/R5 of the etching rate R3 of the stress adjustment layer 122 to the etching rate R5 of the bottom electrode structure 140 is 10-100.

Figure 1F:
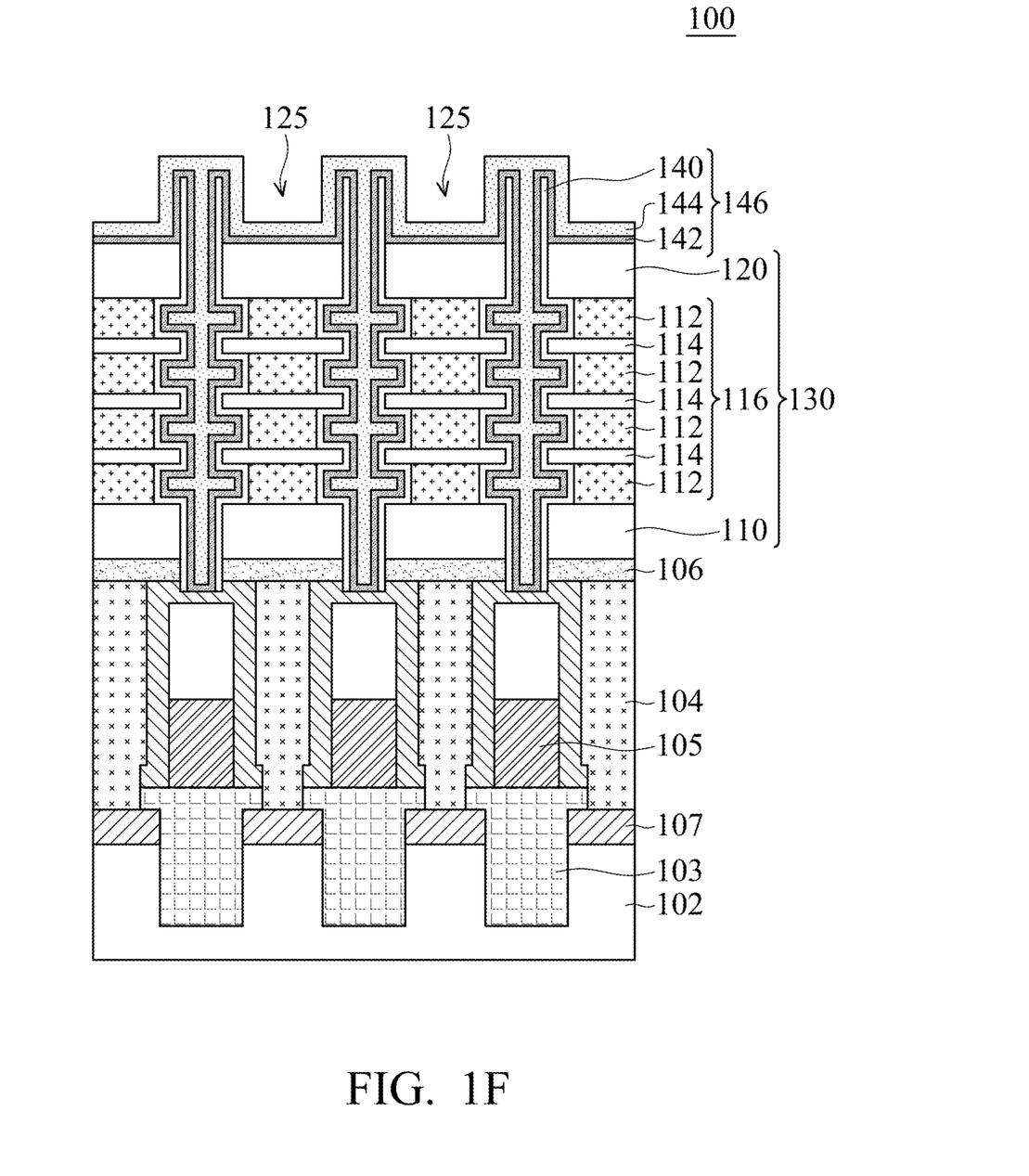

Referring to FIG. 1F, a dielectric layer 142 is conformally formed on the bottom electrode structure 140, the bottom surface of the third opening 119, the top surface of the second support layer 120. The dielectric layer 142 may be formed by using a suitable high-k material. In some embodiments, the dielectric layer 142 may include silicon nitride ($Si_3N_4$), aluminum oxide ($Al_2O_3$), yttrium oxide ($Y_2O_3$), titanium oxide (TiO), hafnium dioxide ($HfO_2$), or zirconium dioxide ($ZrO_2$). The dielectric layer 142 may be formed by an ALD process or other suitable deposition processes.

Then, a top electrode structure 144 is conformally formed on the dielectric layer 142, and the top electrode structure 144 fills the capacitor unit accommodating through hole 121. A plurality of recessed regions 125 are defined by the top of the top electrode structure 144. The material of the top electrode structure 144 may include titanium nitride or titanium silicon nitride (TiSiN). The top electrode structure 144 may be formed by an ALD process or other suitable deposition processes. In this specification, the bottom electrode structure 140, the dielectric layer 142, and the top electrode structure 144 are collectively referred to as "capacitor units 146".

Figure 1G:
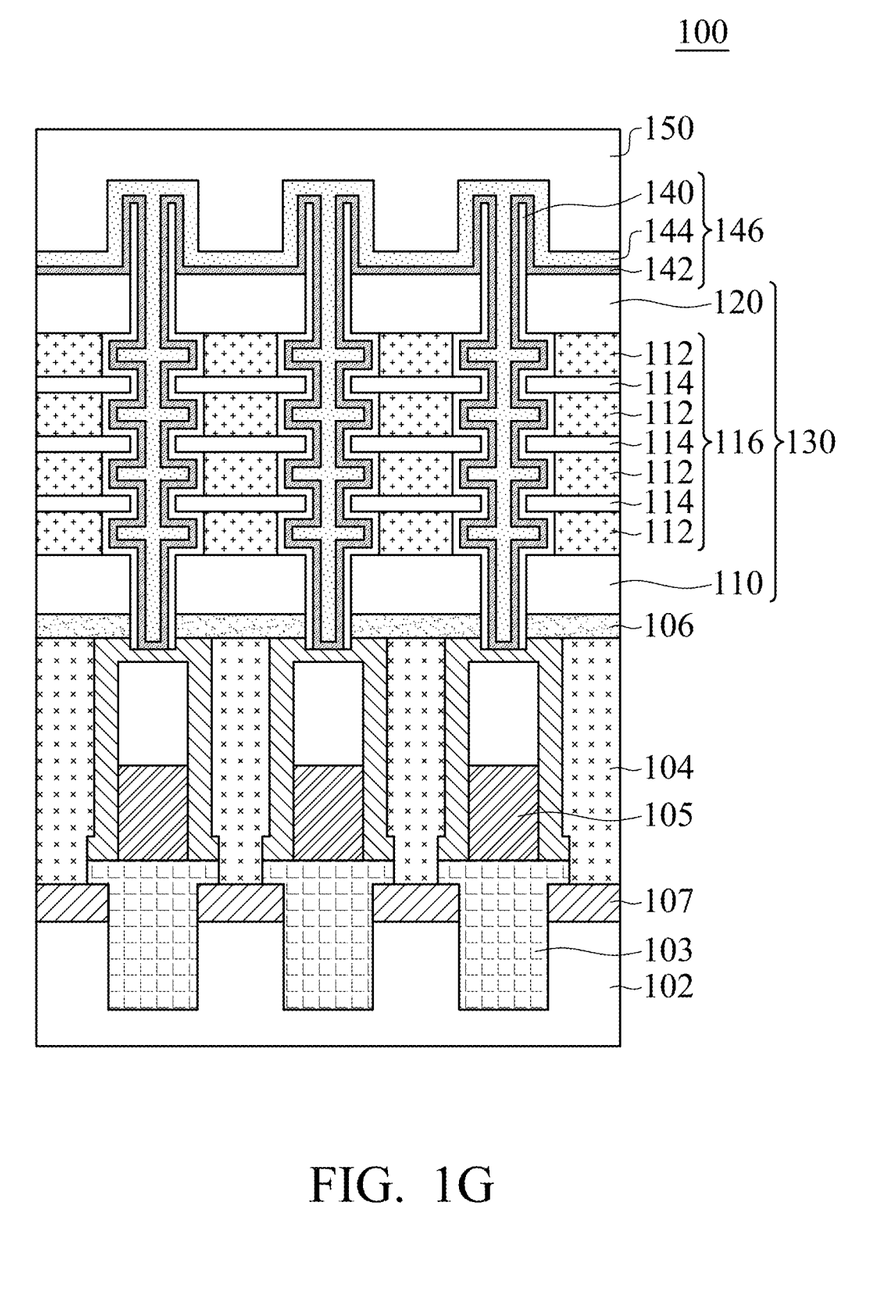

Referring to FIG. 1G, a second conductive layer 150 is formed on the capacitor units 146 and fills the recessed regions 125. The bottom surface of the second conductive layer 150 is higher than the top surface of the second support layer 120. The material of the second conductive layer 150 may include silicon germanium (SiGe) or silicon germanium boron compound (SiGeB). The second conductive layer 150 may be formed by a CVD process or other suitable deposition processes. In the present embodiment, the material of the second conductive layer 150 is different from the material of the top electrode structure 144. This can help to improve the yield of the DRAM device 100, and the details will be discussed in the following paragraphs.

After the second conductive layer 150 is formed, other conventional processes may be subsequently performed to complete the DRAM device 100.

In the manufacturing method of the DRAM device 100 provided in the present embodiment, the first support layer 110 and the second support layer 120 provide a supporting function to prevent the bottom electrode structure 140 from being collapsed or cracked during the manufacturing process. In order to provide an appropriate supporting function and reduce the manufacturing time and cost, the thickness of the first support layer 110 and the thickness of the second support layer 120 may be controlled within appropriate ranges, respectively. For example, in order to provide sufficient support, the thickness of the first support layer 110 is greater than the thickness of the second insulating layer 114. Referring to FIG. 1E, in some embodiments, the first thickness T1 of the first support layer 110 is 20-50 nm, and the second thickness T2 of the second support layer 120 is 50-150 nm.

Furthermore, during the first etching process, if the thickness of the first support layer 110 is too thick, the aperture of the first opening 115 in the second support layer 120 may be excessively widened, which is disadvantageous for the miniaturization of the device. In order to facilitate the miniaturization of the device, the ratio of the thickness of the second support layer 120 to the thickness of the first support layer 110 may be controlled within an appropriate range. Referring to FIG. 1E, in some embodiments, the ratio T2/T1 of the second thickness T2 of the second support layer 120 to the first thickness T1 of the first support layer 110 is 1.5-10.0.

Referring to FIG. 1C and FIG. 1E, in the manufacturing method of the DRAM device 100 provided in the present embodiment, the sidewall of the capacitor unit accommodating through hole 121 has a concave-convex shape, and the profile of the bottom electrode structure 140 corresponds to the profile of the capacitor unit accommodating through hole 121. In other words, a portion of the bottom electrode structure 140 of the FIG. 1E is embedded in the second opening 117, so that a better supporting function can be obtained. Compared with the conventional cup-shaped bottom electrode, the bottom electrode in the present embodiment is less likely to collapse or crack. As a result, the yield of the DRAM device 100 can be further improved.

In order to conformally forming the bottom electrode structure 140 more easier and to avoid the adjacent capacitor unit accommodating through holes 121 being communicated with each other, as well as to provide an appropriate supporting function, and to reduce process time and cost, the ratio of the second width W2 of the second opening 117 to the width W1 of the first opening 115 may be controlled within an appropriate range. Referring to FIG. 1E, in some embodiments, the ratio W2/W1 of the second width W2 of the second opening 117 to the width W1 of the first opening 115 is 1.1-3.

It should be understood that the composite dielectric layer 116 shown in FIGS. 1A-1G is only for illustration, and is not intended to limit the present invention. In some embodiments, the number of the first insulating layer 112 and the second insulating layer 114 may be changed. In other embodiments, the composite dielectric layer 116 may include insulating layers composed of more than three different insulating materials, and the etching rates of these insulating materials are different from one another during the second etching process. Therefore, in such an embodiment, the profile of the sidewall the capacitor unit accommodating through hole 121 may be different from the profile of the sidewall of the capacitor unit accommodating through hole 121 shown in FIG. 1C.

Referring to FIG. 1D, the step of forming the bottom electrode material 140* in the capacitor unit accommodating through hole 121 may cause stress. For example, when the bottom electrode material 140* is titanium nitride, the bottom electrode material 140* generates tensile stress. This stress may cause the substrate 102 to warp or bend, and may also cause the bottom electrode structure 140 to collapse or crack. In the present embodiment, by forming the stress adjustment layer 122, the tensile stress generated by the bottom electrode material 140* can be balanced or counteracted. Therefore, the above-mentioned problems can be avoided, and the yield of the DRAM device 100 can be further improved.

Referring to FIG. 1E and FIG. 1F, the capacitor unit accommodating through hole 121 has a high aspect ratio and has sidewalls having concave-convex shape. In the present embodiment, the dielectric layer 142 and the top electrode structure 144 are formed in the capacitor unit accommodating through hole 121 by the ALD process. The step coverage and the gap-filling ability of the ALD process are both excellent. Therefore, voids are less likely to be formed in the resulted dielectric layer 142 and the top electrode structure 144, which can further improve the yield of the DRAM device 100.

Referring to FIG. 1G, in some embodiments, a DRAM device 100 is provided. The DRAM device 100 includes the interlayer dielectric layer 130 and a plurality of capacitor units 146 formed on the substrate 102. The interlayer dielectric layer 130 includes the first support layer 110, the composite dielectric layer 116, and the second support layer 120 sequentially formed on the substrate 102. The composite dielectric layer 116 includes at least one first insulating layer 112 and at least one second insulating layer 114 alternately stacked. The interlayer dielectric layer 130 has a plurality of capacitor unit accommodating through holes 121 penetrating the interlayer dielectric layer 130. Each of the capacitor unit accommodating through holes 121 forms the first opening 115 in the second insulating layer 114 and forms the second opening 117 communicating with the first opening 115 in the first insulating layer 112. The width of the second opening 117 is greater than the width of the first opening 115. The capacitor unit 146 is formed in the capacitor unit accommodating through hole 121. The tops of the capacitor units 146 are higher than the top surface of the interlayer dielectric layer 130, and the tops of the capacitor units 146 define the recessed regions 125.

In the DRAM device 100 provided in the present embodiment, the capacitance value of the capacitor unit can be significantly increased, thereby greatly improving the performance of the DRAM device 100. More specifically, referring to FIG. 1G, the profile of the bottom electrode structure 140 and the profile of the dielectric layer 142 include similar concave-convex shape. Therefore, compared to the cup-shaped capacitor unit, in the capacitor unit 146 of the present embodiment, the contact area between the bottom electrode structure 140 and the dielectric layer 142 is larger. Furthermore, the top of the capacitor unit 146 is higher than the top surface of the interlayer dielectric layer 130 and defines the recessed regions 125. In other words, the top of the bottom electrode structure 140 is higher than the top surface of the interlayer dielectric layer 130. Therefore, the contact area between the bottom electrode structure 140 and the dielectric layer 142 can also be increased by the recessed regions 125 defined by the capacitor unit 146. As a result, the performance of the DRAM device 100 can be significantly improved.

In the DRAM device 100 provided in the present embodiment, the risk of the bottom electrode structure 140 to collapse or crack during the manufacturing process can be significantly reduced, thereby greatly improving the yield of the memory device. More specifically, referring to FIG. 1G, the sidewall of the composite dielectric layer 116 has a concave-convex shape. During the manufacturing process, the first support layer 110, the composite dielectric layer 116, and the second support layer 120 can provide sufficient support for the bottom electrode structure 140. As a result, short circuit or leakage current can be avoided, and the yield of the DRAM device 100 can be significantly improved.

In the present embodiment, the DRAM device 100 also includes the first conductive layer 106 and a plurality of contact structures 104 formed under the first conductive layer 106. Referring to FIG. 1E, the first conductive layer 106 has a plurality of third openings 119, and each of the third openings 119 communicates with one capacitor unit accommodating through hole 121. Referring to FIG. 1G, the capacitor unit 146 is formed in the third opening 119 and the capacitor unit accommodating through hole 121.

In the conventional DRAM device, the capacitor unit is usually formed directly on the contact structure, so it is difficult to align the bottom electrode structure and the contact structure.

Referring to FIG. 1G, the contact structures 104 are covered by the first conductive layer 106, and the positions of the contact structures 104 do not overlap with the bottom electrode structures 140 in the third openings 119. Furthermore, the contact structures 104 do not directly contact the bottom electrode structures 140. In other words, each of the contact structures 104 is electrically connected to one of the bottom electrode structures 140 through the first conductive layer 106 located above the contact structures 104. Therefore, during the wet etching process (i.e., the second etching process), the first conductive layer 106 can prevent the etching solution from penetrating into the underlying layers, and can protect the contact structures 104. When the third etching process is performed, the contact structures 104 will not be damaged by the etching process. As a result, the yield of the DRAM device can be significantly improved. In addition, the contact structure 104 is electrically connected to the bottom electrode structure 142 through the first conductive layer 106 above the contact structure 104. Even if the position of the bottom electrode structure 142 is deviated, it can be electrically connected to the contact structure 104. Therefore, the difficulty of the manufacturing process can be reduced, and the yield of the DRAM device can be improved.

Referring to FIG. 1E, after the fourth etching process, the bottom electrode material 140* originally located in the capacitor unit accommodating through hole 121 is separated into two bottom electrode structures 140 that are independent of each other. That is, the same capacitor unit accommodating through hole 121 includes two bottom electrode structures 140, and the two bottom electrode structures 140 each belong to different capacitor units 146. Furthermore, in some embodiments, all the capacitor units 146 may share one top electrode structure 144. Therefore, in order to ensure that each of the capacitor units 146 can operate independently, the two bottom electrode structures 140 in the same third opening 119 do not directly contact each other, and the first conductive layers 106 on both sides of the third opening 119 do not directly contact each other.

Referring to FIG. 1E, after the fifth etching process, a plurality of recessed regions 125 are formed. Each of the recessed regions 125 is located between the tops of the two bottom electrode structures 140 which are formed in different capacitor unit accommodating through holes 121.

In the present embodiment, in order to prevent voids from being generated in the dielectric layer 142 and the top electrode structure 144, the dielectric layer 142 and the top electrode structure 144 are formed in the capacitor unit accommodating through hole 121 by the ALD process, and the conductive material (for example, titanium nitride) having better step coverage and the gap-filling ability is used as the material of the top electrode structure 144. Therefore, the resulted top electrode structure 144 has a top surface conforming to the recessed regions 125, as shown in FIG. 1E. In the manufacturing process after FIG. 1G, a dielectric layer, a conductive plug, a conductive line and other structures will be formed on the capacitor unit 146. To avoid the top electrode structure 144 being damaged by the subsequent etching process, or prevent the etching solution from penetrating along the damaged top electrode structure 144 into the underlying substrate or contact structures, in the present embodiment, the second conductive layer 150 is formed on the top electrode structure 144 by the CVD process, and made of silicon germanium. Therefore, the second conductive layer 150 has a flat top surface. In the subsequent manufacturing process, the top electrode structure 114 or other elements below the second conductive layer 150 can be prevented from being damaged, thereby improving the yield of the DRAM device 100.

In summary, in the DRAM device provided in some embodiments of the present invention, the bottom electrode structure has a concave-convex shape. Therefore, the contact area between the bottom electrode structure and the dielectric layer can be greatly increased. Furthermore, the tops of the capacitor units are higher than the top surface of the interlayer dielectric layer, which can also increase the contact area between the bottom electrode structure and the dielectric layer. As a result, the sensing capacitance of the capacitor unit can be significantly increased, thereby improving the performance of the DRAM device. In the DRAM device provided in some embodiments of the present invention, the sidewall of the capacitor unit accommodating through hole has a concave-convex shape. Therefore, the bottom electrode structure can be well supported by the first support layer, the composite dielectric layer, and the second support layer. As a result, short circuit or leakage current can be avoided, and the yield of the DRAM device can be significantly improved. In addition, the manufacturing method of the DRAM provided in some embodiments of the present invention can be easily integrated into the existing DRAM device manufacturing process without additional replacement or modification of production equipment. Therefore, the performance and yield of the DRAM device can be effectively improved without increasing the process complexity and production cost.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A dynamic random access memory (DRAM) device, comprising:
   a substrate;
   an interlayer dielectric layer formed on the substrate, wherein the interlayer dielectric layer has a plurality of capacitor unit accommodating through holes, and each of the capacitor unit accommodating through holes penetrates the interlayer dielectric layer, wherein the interlayer dielectric layer comprises:
      a first support layer formed on the substrate;
      a composite dielectric layer formed on the first support layer, wherein the composite dielectric layer comprises at least one first insulating layer and at least one second insulating layer alternately stacked, wherein each of the capacitor unit accommodating through holes forms a first opening in the second insulating layer and forms a second opening communicating with the first opening in the first insulating layer, and wherein a width of the second opening is greater than a width of the first opening; and
      a second support layer formed on the composite dielectric layer;
   a plurality of capacitor units formed in the capacitor unit accommodating through holes, wherein tops of the capacitor units are higher than a top surface of the interlayer dielectric layer, and the tops of the capacitor units define a recessed region; and
   a first conductive layer formed between the substrate and the interlayer dielectric layer, wherein the first conductive layer has a plurality of third openings communicating with the capacitor unit accommodating through holes, and the capacitor units further formed in the third opening.

2. The DRAM device as claimed in claim 1, further comprising:
   a second conductive layer formed on the capacitor units and filling the recessed region, wherein the second conductive layer has a flat top surface.

3. The DRAM device as claimed in claim 1, further comprising a plurality of contact structures formed under the first conductive layer,
   wherein the capacitor units comprise a plurality of bottom electrode structures, wherein the bottom electrode structures are conformally formed on the surfaces of the capacitor unit accommodating through holes and surfaces of the third openings, and tops of the bottom electrode structures are higher than the top surface of the interlayer dielectric layer, and wherein each of the contact structures is electrically connected to one of the bottom electrode structures through the first conductive layer above each of the contact structures, wherein the contact structures do not overlap with the bottom electrode structures located in the third openings.

4. The DRAM device as claimed in claim 3, wherein two of the bottom electrode structures are located in each of the capacitor unit accommodating through holes.

5. The DRAM device as claimed in claim 3, wherein the capacitor units further comprise:

a dielectric layer conformally formed on surfaces of the bottom electrode structures and the top surface of the interlayer dielectric layer; and a top electrode structure conformally formed on a surface of the dielectric layer, wherein a top of the top electrode structure defines the recessed region, and the recessed region is located between tops of two of the bottom electrode structures formed in different capacitor unit accommodating through holes.

6. The DRAM device as claimed in claim 5, further comprising:

a second conductive layer formed on the capacitor units and filling the recessed region, wherein the second conductive layer has a flat top surface, wherein a material of the second conductive layer is different from a material of the top electrode structure.

7. The DRAM device as claimed in claim 5, wherein a material of the top electrode structure comprises titanium nitride or titanium silicon nitride.

8. The DRAM device as claimed in claim 2, wherein a material of the second conductive layer comprises silicon germanium or silicon germanium boron compound.

9. The DRAM device as claimed in claim 1, wherein the first support layer has a first thickness, the second support layer has a second thickness, and a ratio of the second thickness to the first thickness is 1.5-10.0.

10. The DRAM device as claimed in claim 1, wherein a material of the first insulating layer is oxide, a material of the second insulating layer is nitride, and a thickness of the first support layer is greater than a thickness of the second insulating layer.

11. A method for manufacturing a DRAM device, comprising:

forming a first conductive layer over a substrate;

forming an interlayer dielectric layer on the first conductive layer, wherein the interlayer dielectric layer has a plurality of capacitor unit accommodating through holes, and each of the capacitor unit accommodating through holes penetrates the interlayer dielectric layer, wherein forming the interlayer dielectric layer comprises:

forming a first support layer on the substrate;

forming a composite dielectric layer on the first support layer, wherein the composite dielectric layer comprises at least one first insulating layer and at least one second insulating layer alternately stacked, wherein each of the capacitor unit accommodating through holes forms a first opening in the second insulating layer and forms a second opening communicating with the first opening in the first insulating layer, and wherein a width of the second opening is greater than a width of the first opening; and forming a second support layer on the composite dielectric layer; and forming a plurality of capacitor units in the capacitor unit accommodating through holes, wherein tops of the capacitor units are higher than a top surface of the interlayer dielectric layer, and the tops of the capacitor units define a recessed region, wherein the first conductive layer has a plurality of third openings communicating with the capacitor unit accommodating through holes, and the capacitor units further formed in the third opening.

12. The method for manufacturing the DRAM device as claimed in claim 11, further comprising:

forming a contact structure in the substrate; and forming a stress adjustment layer on the second support layer, wherein a material of the stress adjustment layer comprises silicon oxynitride, silicon oxide, or silicon nitride.

13. The method for manufacturing the DRAM device as claimed in claim 12, wherein forming the capacitor unit comprises:

performing a first etching process to form the first opening penetrating the stress adjustment layer, the second support layer, the at least one first insulating layer, the at least one second insulating layer, and the first support layer;

performing a second etching process to remove a portion of the first insulating layer and form the second opening in the first insulating layer;

performing a third etching process to form the third opening in the first conductive layer;

conformally forming a bottom electrode material on surfaces of the capacitor unit accommodating through holes, a surface of the third opening, and a surface of the stress adjustment layer;

performing a fourth etching process to remove the bottom electrode material located on a bottom surface of the third opening and a top surface of the stress adjustment layer, so that a plurality of bottom electrode structures are formed, wherein the contact structure is electrically connected to one of the bottom electrode structures through the first conductive layer above the contact structure;

performing a fifth etching process to remove the stress adjustment layer, so that the plurality of bottom electrode structures protrude beyond the second support layer;

conformally forming a dielectric layer on the plurality of bottom electrode structures, the bottom surface of the third opening, and a top surface of the second support layer;

conformally forming a top electrode structure on the dielectric layer, wherein the top electrode structure the capacitor unit accommodating through holes, and wherein a top of the top electrode structure defines a recessed region.

14. The method for manufacturing the DRAM device as claimed in claim 13, further comprising:

forming a second conductive layer on the capacitor units and filling the recessed region, wherein the second conductive layer has a flat top surface.

15. The method for manufacturing the DRAM device as claimed in claim 13, wherein during the second etching process, a ratio of the etching rate of the first insulating layer to the etching rate of the second insulating layer is 10-100.

16. The method for manufacturing the DRAM device as claimed in claim 13, wherein during the fifth etching process, a ratio of the etching rate of the stress adjustment layer to the etching rate of the second support layer is 10-100.

17. The method for manufacturing the DRAM device as claimed in claim 13, wherein the dielectric layer and the top electrode structure is formed by an atomic layer deposition process.

18. The method for manufacturing the DRAM device as claimed in claim 13, wherein the contact structure does not overlap with the bottom electrode structures located in the third openings.

19. The method for manufacturing the DRAM device as claimed in claim 14, wherein a material of the second conductive layer is different from a material of the top electrode structure.

20. The method for manufacturing the DRAM device as claimed in claim 19, wherein a material of the second conductive layer comprises silicon germanium or silicon germanium boron compound.

\* \* \* \* \*